United States Patent [19]

Anderson et al.

[11] Patent Number: 4,535,052

[45] Date of Patent: Aug. 13, 1985

[54] CONSTRAINED N-ALKYLAMINO ARYL KETONES AS SENSITIZERS FOR PHOTOPOLYMER COMPOSITIONS

[75] Inventors: Albert G. Anderson; Thomas E. Dueber, both of Wilmington, Del.

[73] Assignee: E. I. Du Pont de Nemours and Company, Wilmington, Del.

[21] Appl. No.: 645,115

[22] Filed: Aug. 28, 1984

Related U.S. Application Data

[63] Continuation-in-part of Ser. No. 490,956, May 2, 1983, abandoned.

[51] Int. Cl.$^3$ .......................... G03C 1/94; G03C 1/68
[52] U.S. Cl. .................................. 430/277; 430/281; 430/285; 430/920; 430/916; 430/925; 204/159.23
[58] Field of Search .................. 204/159.23; 430/919, 430/920, 342, 343, 913, 916, 926, 925, 281, 287, 285

[56] References Cited

U.S. PATENT DOCUMENTS

| | | | |
|---|---|---|---|
| Re. 28,789 | 4/1976 | Chang | 430/281 X |
| 3,479,185 | 11/1969 | Chambers | 96/84 |
| 3,549,367 | 12/1970 | Chang et al. | 430/278 |
| 3,552,973 | 1/1971 | Fishman | 430/340 |
| 3,759,807 | 9/1973 | Osborn et al. | 204/159.23 |
| 3,926,643 | 12/1975 | Chang | 430/922 |
| 3,945,833 | 3/1976 | Sumita et al. | 430/916 X |
| 3,953,309 | 4/1976 | Gilano et al. | 204/159.16 |
| 4,131,529 | 12/1978 | Osterloh et al. | 204/159.14 |
| 4,188,224 | 2/1980 | Felder et al. | 204/159.15 |
| 4,341,860 | 7/1982 | Sysak | 430/277 |

OTHER PUBLICATIONS

R. W. Castelino and G. Hallas, "Electronic Absorption Spectra of Some Analogues and Derivatives of Michler's Ketone," *Journal of the Chemical Society*, (London), Sec. B, 1971, pp. 1468–1471.

YC. C. Barker and G. Hallas, *Journal of the Chemical Society*, (London), Sec. B., 1969, pp. 1068–1071.

*Hackh's Chemical Dictionary*, (4th Ed.), McGraw-Hill Book Co., New York, 1977, p. 46.

*An American National Standard:ASTM/IEEE Standard Metric Practice*, (Approved Aug. 17, 1976), Institute of Electrical & Electronics Engineers, Inc., New York, NY, p. 358.

K. D. Bartle, G. Hallas & J. D. Hepworth, *Organic Magnetic Resonance*, vol. 7, No. 4, 1975, pp. 154–159.

*Primary Examiner*—John E. Kittle
*Assistant Examiner*—Cynthia Hamilton

[57] ABSTRACT

Photopolymerizable compositions comprising
(a) at least one ethylenically unsaturated compound,
(b) at least one organic polymeric binder,
(c) optionally at least one photoinitiator and
(d) at least one constrained N-alkylamino aryl ketone compound as defined, e.g., bis(9-julolidyl ketone), bis-(N-ethyl-1,2,3,4-tetrahydro-6-quinolyl)ketone, etc. The compositions, in layer form, are useful in photoresists, including projection speed photoresists, printing plates, drafting and toning films, etc.

10 Claims, No Drawings

CONSTRAINED N-ALKYLAMINO ARYL KETONES AS SENSITIZERS FOR PHOTOPOLYMER COMPOSITIONS

CROSS REFERENCE TO RELATED APPLICATION

This is a continuation-in-part of application Ser. No. 490,956, filed May 2, 1983, abandoned.

DESCRIPTION

TECHNICAL FIELD

This invention relates to photopolymerizable compositions. More particularly this invention relates to photopolymerizable compositions containing constrained N-alkylamino aryl ketones capable of increasing the speed of polymerization.

BACKGROUND ART

Photopolymerizable compositions are widely used for an increasing number of usages. For example this type of composition is now commercially used in printing, copying resist formation, etc. Such compositions generally contain an ethylenically unsaturated compound or other type polymerizable compound, a photoinitiator or photoinitiator system and preferably a solvent-soluble or aqueous or alkaline soluble organic polymeric binder compound. Many of the known useful photopolymerizable compositions, however, are limited in applicability because the initiators are not as active as desired.

Chambers U.S. Pat. No. 3,479,185 discloses photopolymerizable compositions containing an ethylenically unsaturated monomer, a free radical producing agent such as an amine substituted leuco triphenylamine dye and a hexaarylbiimidazole. These compositions are photoinitiatable in the ultraviolet region of the spectrum. Chambers, however, found that by adding energy-transfer dyes of the xanthene and acridine classes the sensitivity of the photopolymerizable compositions was extended into the visible spectral region with an increase in speed of polymerization.

Chang U.S. Pat. No. 3,549,367 discloses photopolymerizable compositions containing hexaarylbiimidazoles and p-aminophenyl ketones, e.g., Michler's ketone, which increase the speed of polymerization of the compositions.

It is generally assumed that photosensitization by Michler's ketone, e.g., Chang U.S. Pat. No. 3,549,367, occurs via the triplet state; see also D. I. Schuster, M. D. Goldstein and P. Bane, J. Amer. Chem. Soc., 99, 1977, pages 187–193. When a molecule absorbs light the exciting energy may be partitioned through various pathways among triplet and singlet states. This is shown diagrammatically by a Jablonski diagram as given by R. O. Kan, "Organic Photochemistry," McGraw-Hill Book Co., NY 1966 page 12, and explained by J. B. Birks, "Photophysics of Aromatic Molecules," Wiley-Interscience, London, 1970, pages 30-32, and N. J. Turro, "Modern Molecular Photochemisry, Benjamin/Cummings Publishing Co., Menlo Park, CA, 1978, page 5 (FIG. 1.2). From the diagrams it can be seen that any pathway that serves to prevent the triplet state from becoming populated, either by shortening the lifetime of the triplet state, e.g., by phosphorescence, or preventing the formation of the triplet state, e.g., by fluorescence, will decrease the usefulness of the compound as a photosensitizer. The quantum yield of phosphorescence for the compounds relative to Michler's ketone is determined by the formula: $\phi p(X)/\phi p(Mk)$ (Michler's ketone value is therefore 1.0). The compounds found to have relative quantum yields of phosphorescence greater than 1.0 exhibit a shorter triplet state lifetime than the triplet state lifetime of Michler's ketone (I. B. Berlman, "Handbook of Fluorescence Spectra of Aromatic Molecules," second edition, Academic Press New York, 1971 page 41, formula 16, and N. J. Turro, ibid, page 90, formula 5.23 and page 109, formula 5.42). The compounds with higher relative quantum yield of phosphorescence would not be expected to photosensitize addition polymerization as well as Michler's ketone because the particular triplet would not live as long as the triplet of Michler's ketone and therefore not have the same opportunity to transfer its triplet energy before it lost it through phosphorescence. The presence of additional rings or bridges on Michler's ketone causes the molecules to have moderate to strong fluorescence, while under the conditions employed, Michler's ketone was found not to fluoresce. It would appear that the presence of additional rings or bridges on Michler's ketone is unexpectedly causing profound alteration of the photophysics of these molecules similar to the known alteration of energy levels in Michler's ketone itself by changes in solvent (D. I. Schuster, et al., idem.). Since fluorescence is a pathway whereby the excited singlet returns to the ground state without passing through the triplet state, compounds which show increased fluorescence at 77° K. and room temperature would not be expected to sensitize as effectively as Michler's ketone. Fishman U.S. Pat. No. 3,552,973, column 3, lines 60 to 62, states that his disclosed ketone sensitizers "are naturally phosphorescent in rigid media at low temperatures, such as in ether-isopentane alcohol glass at 77° K." In addition, none of the compounds that Fishman discloses are naturally fluorescent under these conditions. It would therefore be expected that the triplet state of Fishman's disclosed compounds at low temperature or in rigid media would be more highly populated since energy wasting fluorescence is not present.

While the aforementioned compositions have provided improved photopolymerizable compositions, there is a need to provide photopolymerizable compositions having improved photospeed.

DISCLOSURE OF THE INVENTION

In accordance with this invention there is provided a photopolymerizable composition comprising an admixture of (a) at least one nongaseous ethylenically unsaturated compound having at least one terminal ethylenically unsaturated group, a boiling point above 100° C. at normal atmospheric pressure and being capable of addition polymerization, (b) at least one organic polymeric binder compound, (c) optionally at least one photoinitiator or photoinitiator system, the improvement wherein the composition contains (d) 0.001 to 15% by weight of the total composition of at least one constrained N-alkylamino aryl ketone of the formulas:

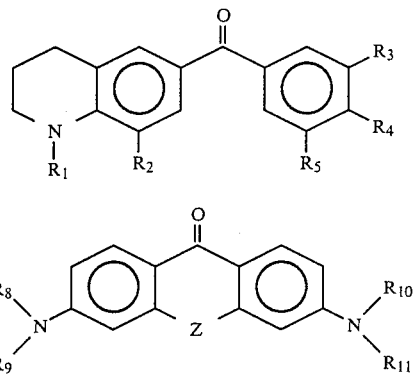

$R_1$ is lower alkyl of 1 to 4 carbons;
$R_2$ is H or taken together with $R_1$ is —CH₂CH₂CH₂—;
$R_4$ is H, —OCH₃ or

$R_6$ and $R_7$ are lower alkyl of 1 to 4 carbon atoms;
$R_3$ is H or taken together with $R_6$ is —CH₂CH₂CH₂—;
$R_5$ is H or taken together with $R_7$ is —CH₂CH₂CH₂—;
$R_8$, $R_9$, $R_{10}$, $R_{11}$ are lower alkyl of 1-4 carbon atoms; and
Z is a bridge between the two aromatic rings taken from the group of —CH₂—, —C(CH₃)₂—, —O—.

The photopolymerizable compositions of this invention comprise (a) at least one ethylenically unsaturated compound,
(b) at least one organic polymeric binder,
(c) optionally at least one photoinitiator or photoinitiator system, and
(d) at least one constrained N-alkylamino aryl ketone defined above and described more fully below.

Other useful additives in the photopolymerizable composition include: inhibitors, leuco dyes, accelerators such as chain transfer agents and oxygen scavengers, as well as inert components such as plasticizers, dyes and pigments to increase visibility of the image, fillers, etc.

The ethylenically unsaturated compound (monomer) can be present in the photopolymerizable composition in an amount of 3 to 97 parts by weight, and the organic polymeric binder can be present in an amount of 97 to 3 parts by weight based on the total weight of monomer and binder. The photoinitiator when present can be used in an amount of 0.001 to 20 parts by weight per 100 parts by weight of the combined weight of ethylenically unsaturated compound and binder. The ketone compound can be present in an amount of 0.001 to 15 parts by weight, preferably 0.05 to 5 parts by weight, per 100 parts by weight of the combined weight of ethylenically unsaturated compound and binder. The other additives can be present in minor amounts known to those skilled in the art.

The ethylenically unsaturated compounds (a) (photopolymerizable monomers of this invention) have a boiling point above 100° C. at normal atmospheric pressure and are capable of forming a high molecular weight polymer by photoinitiated, addition polymerization. Suitable compounds are disclosed in Chang U.S. pat. No. 3,756,827, column 2, line 36 to column 3, line 30, the disclosure of which is incorporated herein by reference. Other useful monomers include ethylenically unsaturated diester polyhydroxy polyethers as described in Chambers U.S. Pat. No. 4,245,031. Examples include the Epocryl ® resins sold by Shell Chemical Co. Many of the polymerizable monomers are subject to thermal polymerization, especially when stored for long periods or at elevated temperatures. When such compounds are supplied commercially, it is customary for them to contain a small, but effective, amount of a thermal polymerization inhibitor. These inhibitors may be left in the monomers when the photopolymerizable coating compositions of this invention are prepared. The resulting compositions usually have satisfactory thermal stability. If unusual thermal exposure is anticipated, or if monomers containing little or no thermal polymerization inhibitor are employed, compositions with adequate shelf life can be obtained by incorporating, e.g., up to 0.5 percent, by weight of monomer, of a thermal polymerization inhibitor such as hydroquinone, methylhydroquinone, p-methoxyphenol, etc. Preferred ethylenically unsaturated compounds are tetraethylene glycol dimethacrylate and trimethylolpropane triacrylate.

Macromolecular organic polymeric binders (b) present in the photopolymerizable compositions include: (1) copolyesters based on terephthalic, isophthalic, sebacic, adipic and hexahydroterephthalic acids; (2) nylons or polyamides; (3) vinylidene chloride copolymers; (4) ethylene/vinyl acetate copolymers; (5) cellulosic ethers; (6) polyethylene; (7) synthetic rubbers; (8) cellulose esters; (9) polyvinyl esters including polyvinyl acetate/acrylate and polyvinyl acetate/methacrylate copolymers; (10) polyacrylate and poly-α-alkyl-acrylate esters, e.g., polymethyl methacrylate and polyethyl methacrylate; (11) high molecular weight ethylene oxide polymers (polyethylene glycols) having weight average molecular weights from 4000 to 4,000,000; (12) polyvinyl chloride and copolymers; (13) polyvinyl acetal; (14) polyformaldehydes; (15) polyurethanes; (16) polycarbonates; and (17) polystyrenes.

In a preferred embodiment of the invention, the polymeric binder is selected so that the unexposed photopolymerizable coating is soluble in predominantly aqueous solutions, for example dilute aqueous alkaline solutions, but upon exposure to actinic radiation becomes relatively insoluble therein. Typically, polymers which satisfy these requirements are carboxylated polymers, for example vinyl addition polymers containing free carboxylic acid groups. Preferred binders include a 1:1 copolymer of styrene/maleic anhydride partially esterified with an isobutanol mixture, e.g., acid no. ca. 190, wt. ave. mol. wt. ca. 10,000; and a combination of a copolymer of styrene/maleic anhydride and a terpolymer of ethyl acrylate/methylmethacrylate/acrylic acid. Another preferred group of binders includes polyacrylate esters and poly-α-alkyl-acrylate ester, particularly polymethyl methacrylate.

Preferably at least one photoinitiator (c) is present in the photopolymerizable compositions. Useful photoinitiator types include: hexaarylbiimidazole compounds which are preferred, 4-trichloromethyl-4-2,5-cyclohexadienones, quinones, alkylaryl ketones, benzophenones, and mixtures thereof. The biimidazoles are photodissociable to the corresponding triarylimidazolyl radicals. These hexaarylbiimidazoles absorb maximally in the 255-275 nm region, and usually show some, though lesser absorption in the 300–375 nm region. Although the absorption bands tend to tail out to include wavelengths as high as about 430 nm, they normally require light rich in the 255–375 nm wavelengths for their dissociation.

The hexaarylbiimidazoles can be represented by the formula:

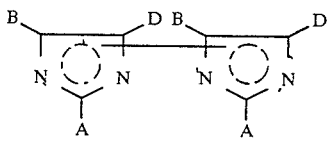

wherein A, B and D represent aryl groups which can be the same or different, carbocyclic or heterocyclic, unsubstituted or substituted with substituents that do not interfere with the dissociation of the hexaarylbiimidazole to the triarylimidazolyl radical and each dotted circle stands for four delocalized electrons (i.e., two conjugated double bonds) which satisfy the valences of the carbon and nitrogen atoms of the imidazolyl ring. The B and D aryl groups can each be substituted with 0–3 substituents and the A aryl groups can be substituted with 0–4 substituents. Useful 2,4,5-triarylimidazolyl dimers are disclosed in Baum & Henry U.S. Pat. No. 3,652,275, column 5, line 44 to column 7, line 16, the disclosure of which is incorporated herein by reference.

Useful quinone types are: camphorquinone, substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetra-hydronaphthacenequinone, 1,2,3,4-tetrahydronaphthacenequinone, and 1,2,3,4-tetrahydrobenz(a)anthracene-7,12-dione.

Useful alkylaryl ketones include: vicinal ketaldonyl alcohols such as benzoin, pivaloin, acyloin ethers, e.g., benzoin methyl ether, benzoin ethyl ether, benzoin isopropyl ether, benzoin phenyl ether, benzoin t-butyl ether, benzoin sec-butyl ether, benzoin isobutyl ether, benzoin n-butyl ether; α-hydrocarbon-substituted aromatic acyloins, including α-methylbenzoin, α-allylbenzoin and α-phenylbenzoin, benzoin dialkyl ketals such as benzil dimethylketal, benzil ethyleneglycol ketal, benzil, benzoin esters such as O-acetyl benzoin and O-acylated oximinoketones such as 1-phenyl-1,2-propanedione-2-O-benzoyloxime.

Useful benzophenones include: benzophenone, 4,4'-dichlorobenzophenone, fluorenone, anthrone, thioxanthenone, xanthenone, 4-dimethylaminobenzophenone, 4-morpholinobenzophenone.

4-Trichloromethyl-4-methyl-2,5-cyclohexadienone compounds useful in this invention are disclosed in Sysak U.S. Pat. No. 4,341,860, the disclosure of which is incorporated by reference. Useful such compounds include:

4-methyl-4-trichloromethyl-2,5-cyclohexadienone
2,6-dimethyl-4-trichloromethyl-2,5-cyclohexadienone
3,4-dimethyl-4-trichloromethyl-2,5-cyclohexadienone
4-nonyl-4-trichloromethyl-2,5-cyclohexadienone
4-trichloromethyl-3,4,5-trimethyl-2,5-cyclohexadienone
2,6-di-(t-butyl)-4-trichloromethyl-2,5-cyclohexadienone
2,6-di(t-butyl)-4-methyl-4-trichloromethyl-2,5-cyclohexadienone
2,6-dichloro-4-methyl-4-trichloromethyl-2,5-cyclohexadienone
2,6-dibromo-4-methyl-4-trichloromethyl-2,5-cyclohexadienone
2,4-dimethyl-4-trichloromethyl-2,5-cyclohexadienone
4-trichloromethyl-2,4,5-trimethyl-2,5-cyclohexadienone
4-phenyl-4-trichloromethyl-2,5-cyclohexadienone
2-methoxy-4-methyl-4-trichloromethyl-2,5-cyclohexadienone
2,6-dimethoxy-4-methyl-4-trichloromethyl-2,5-cyclohexadienone
2,3-benzo-4-methyl-4-trichloromethyl-2,5-cyclohexadienone
2,4,6-tri(t-butyl)-4-trichloromethyl-2,5-cyclohexadienone
4-trichloromethyl-2,4,6-trimethyl-2,5-cyclohexadienone
4-t-butyl-4-trichloromethyl-2,5-cyclohexadienone
2,3,4,5,6-pentamethyl-4-trichloromethyl-2,5-cyclohexadienone
2,4,6-tri(t-pentyl)-4-trichloromethyl-2,5-cyclohexadienone
4-benzyl-4-trichloromethyl-2,5-cyclohexadienone
2-t-butyl-4-trichloromethyl-2,5-cyclohexadienone
2-i-propyl-4-methyl-4-trichloromethyl-2,5-cyclohexadienone
2-t-butyl-4-methyl-4-trichloromethyl-2,5-cyclohexadienone
2-ethyl-4,5-dimethyl-4-trichloromethyl-2,5-cyclohexadienone
2,3-benzo-4,5-dimethyl-4-trichloromethyl-2,5-cyclohexadienone Additional useful compounds are similarly substituted -4-dichloromethyl-2,5-cyclohexadienones as those described above.

The ketone compound (d) of this invention have been defined broadly above. Preferred compounds include:
1. bis(9-julolidyl ketone); also called bis 9,9-(2,3,6,7-tetrahydro-1H,5H-benzo[i,j]quinolizinyl)methanone
2. bis-(N-ethyl-1,2,3,4-tetrahydro-6-quinolyl)ketone
3. p-methoxyphenyl-(N-ethyl-1,2,3,4-tetrahydro-6-quinolyl)ketone
4. 2,7-bis-N,N-dimethylaminofluorenone
5. 2,7-bis-N,N-dimethylamino-9,9-dimethyl-10-anthrone.

The formulas for the above ketone compounds are as follows:

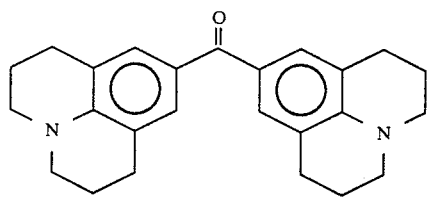

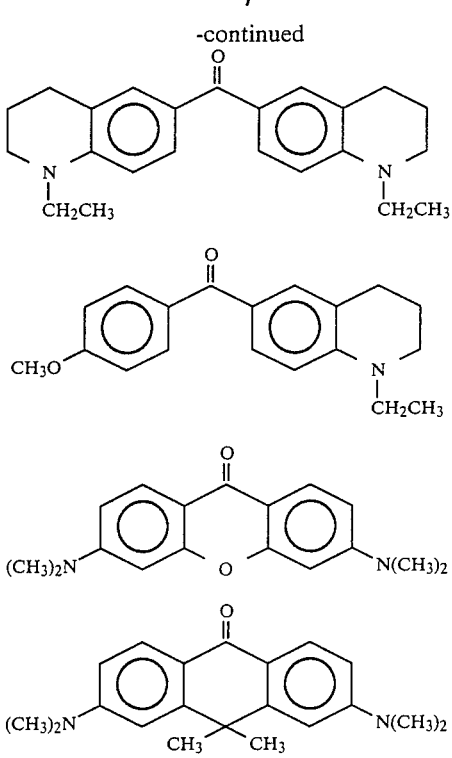

Preparation of diarylmethanes and subsequent oxidation of the desired ketones, such as compounds 1 and 2 above, can be prepared according to the methods of C. Barker and G. Hallas, J. Chem. Soc. (B), 1068 (1969). Procedures for preparing the sensitizers precede the examples.

Optionally, leuco dyes can also be present in the photopolymerizable composition. By the term "leuco dye" is meant the colorless (i.e., the reduced) form of a dye compound which can be oxidized to its colored form by the triarylimidazolyl radical. Leuco dyes are disclosed in Baum & Henry U.S. Pat. No. 3,652,275, column 7, line 24 to column 11, line 32, the disclosure of which is incorporated herein by reference.

Accelerators or reducing agents such as oxygen scavengers and active hydrogen donors acting as chain transfer agents are useful additions to compositions to improve photospeed. Oxygen scavengers that have been found to be useful are phosphines, phosphonites, phosphites, stannous salts and other compounds that are easily oxidized by oxygen. Useful chain transfer agents are N-phenyl glycine, trimethylbarbituric acid, 2-mercaptobenzoxazole, 2-mercaptobenzothiazole, and other compounds that have hydrogens that are readily abstractable by radicals.

A wide range of nonpolymerizable plasticizers are effective in achieving improved exposure and development temperature latitude. Selection of a suitable plasticizer is determined by compatibility with other components of the photopolymerizable composition, particularly the binder, monomer and other components. With acrylic binders, for example, dibutyl phthalate and other esters of aromatic acids; esters of aliphatic polyacids such as diisooctyl adipate, nitrate esters, etc.; aromatic or aliphatic acid esters of glycols, polyoxyalkylene glycols, aliphatic polyols, etc.; alkyl and aryl phosphates; low molecular weight polyester of poly-α-methylstyrenes; chlorinated paraffins; and sulfonamide types may be used. In general, water insoluble plasticizers are preferred for greater high humidity storage stability, but are not necesssary to get improved latitude. Other inert additives such as dyes, pigments and fillers are known to those skilled in the art. These additives are generally present in minor amounts and should not interfere with the exposure of the photopolymerizable layer.

The photopolymerizable compositions described herein may be coated on a wide variety of substrates. By "substrate" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include alumina-blasted aluminum, anodized aluminum, alumina-blasted polyethylene terephthalate film, polyethylene terephthalate film, e.g., resin-subbed polyethylene terephthalate film, flame or electrostatic discharge treated polyethylene terephthalate film, polyvinyl alcohol-coated paper, crosslinked polyester-coated paper, nylon, glass, cellulose acetate film, heavy paper such as lithographic paper, and the like. The particular substrate will generally be determined by the use application involved. For example, when printed circuits are produced, the substrate may be a plate which is a copper coating on fiberboard.

Preferably the layer of the photopolymerizable compositions have a thickness ranging from about 0.0001 inch (~0.0003 cm) to about 0.01 inch (0.025 cm) and are adhered with low to moderate adherence to a thin, flexible, polymeric film support which may transmit radiation actinic to the photopolymerizable layer. The opposite side of the photopolymerizable layer may have adhered thereto a protective cover layer or cover sheet wherein the sheet has less adherence to the layer than the adherence between the film support and the layer. Preferred supports are a transparent polyethylene terephthalate film having a thickness of about 0.001 inch (~0.0025 cm) and a copper support. Polyethylene, 0.001 inch (~0.0025 cm) is a preferred cover sheet; polyvinyl alcohol coating is a preferred cover layer.

Any convenient source of actinic radiation providing wavelengths in the region of the spectrum that overlap the absorption bands of the ketone compounds can be used to activate the photopolymerizable compositions for radical formation, image formation and photopolymerization initiation. The light can be natural or artificial, monochromatic or polychromatic, incoherent or coherent, and for high efficiency should correspond closely in wavelengths to the sensitizer's principal absorption bands and should be sufficiently intense to activate a substantial proportion of the ketone compound.

Conventional light sources include fluorescent lamps, mercury, metal additive, pulsed xenon, and arc lamps providing narrow or broad light bands centered near 405, 436 and 546 nm (Hg) wavelengths. Coherent light sources are the pulsed xenon chloride, argon ion, and ionized neon-lasers. Visible emitting cathode ray tubes widely useful in printout systems for writing on photosensitive materials are also useful with the subject compositions. These in general involve an ultraviolet or visible-emitting phosphor internal coating as the means for converting electrical energy to light energy and a fiber optic face plate as the means for directing the radiation to the photosensitive target.

A preferred mode is illustrated in Example 2 wherein bis-(N-ethyl-1,2,3,4-tetrahydro-6-quinolyl)ketone is used in conjunction with a hexaarylbiimidazole photoinitiator.

INDUSTRIAL APPLICABILITY

The photopolymerizable compositions of this invention are useful in photoresists in making printed circuits or in chemical milling, and as soldermasks. The increased speed of the compositions is particularly useful in projection speed photoresists. The increase in speed results in a saving of energy and related costs since lower energy exposure sources can be used or more elements can be exposed and developed in a given amount of time. Alternatively, the photopolymerizable element can be exposed by means of an exposure source maintained at a greater distance than normal for known sensitized elements. The photopolymerizable compositions are also useful in printing plates for offset and letterpress, engineering drafting films, toning films, etc.

EXAMPLES

The invention is illustrated by the following examples wherein the parts and percentages are by weight. The molecular weights of polymeric compounds are weight average molecular weights ($\overline{M}w$). The $\overline{M}w$ of the polymers can be determined by using a light scattering technique using known standard samples, e.g., polystyrene, polymethacrylic acid, polymethylmethacrylate, etc. as known to those skilled in the art. Compounds used in the examples are prepared as follows:

1. Bis(9-julolidyl ketone)

A. Preparation of dijulolidyl methane (Reference: C. Barker, G. Hallas J. Chem. Soc. (B), 1068 (1969))

A solution of 10 g of julolidine (Aldrich Chemical Co., Milwaukee, Wis.) in 29 ml of distilled water was stirred at room temperature as hydrochloric acid (conc.) was added dropwise until a pH of 4 was obtained. Two ml of 40% formalin was added and the solution was heated to reflux for 6 hours, cooled to room temperature and stirred overnight. The mixture was made basic with concentrated ammonium hydroxide, the supernatant liquid poured off the gummy solid and the residue stirred with 2B alcohol until crystallization occurred. The solid was collected by filtration and recrystallized from acetone to give 5.59 g of brown needles, mp 114°–119° C. The yield was 54%.

B. Preparation of bis(9-julolidyl ketone)

In a 250 ml one neck RB flask containing 100 ml absolute ethanol was added with stirring 3.77 g dijulolidyl methane, prepared as described in A, and 5.23 g chloranil. The dark green mixture was refluxed for 1 hour, and the ethanol was removed by rotary evaporating the mixture to near dryness. Sodium hydroxide (5% solution) was added until the mixture was basic and 500 g methylene chloride was added. The layers were separated and the methylene chloride layer was dried with 5 g anhydrous magnesium sulfate with stirring. The filtered solution was concentrated to 50 cc and eluted through neutral Woelm Alumina. A middle fraction from elution with methylene chloride, after rotary evaporation to dryness gave 0.6 g of yellow crystals, mp 243°–245° C. Other fractions totalled 1.2 g, mp 241°–243° C. The total yield was 46%. An ultraviolet spectrum in ethanol gave wavelength of maximum absorption ($\lambda_{max}$) of 390 nm, and the molar extinction coefficient ($\epsilon$) was 51,400.

2. Bis-(N-ethyl-1,2,3,4-tetrahydro-6-quinolyl)ketone

A. Preparation of bis-(n-ethyl-1,2,3,4-tetrahydro-6-quinolyl)methane

To 52 ml of distilled water with stirring was added 16.60 g (0.013 mole) N-ethyl tetrahydroquinoline, followed by the slow addition of 10.5 g of concentrated hydrochloric acid. The solution (pH 3–4) was stirred as 3.6 ml of 38% formalin solution was added, heated to reflux for 7 hours and stirred at room temperature overnight. The mixture was made basic with concentrated ammonium hydroxide and the product extracted with methylene chloride. This solution was dried with anhydrous magnesium sulfate, filtered and was rotary evaporated to dryness to yield 17.14 g of an oil (99.5% yield). Crystallization occurred on stirring with ethanol, mp 61°–65° C.

B. Preparation of bis-(N-ethyl-1,2,3,4-tetrahydro-6-quinolyl)ketone

To 400 ml absolute ethanol was added with stirring 16 g (0.0478 mole) bis-(N-ethyl-1,2,3,4-tetrahydro-6-quinolyl)methane, prepared as described in A, and 23.82 g chloranil. The green mixture was heated to reflux for 1 hour, cooled to room temperature over 1 hour and rotary evaporated to dryness. The residue was taken up in methylene chloride and eluted through neutral Woelm Alumina. A red solid remained on the top of the column. The fractions were rotary evaporated to dryness and the oil taken up in ethanol to yield light yellow crystals which were collected by filtration to give 6.06 g, mp 120°–120.5° C. (36.4% yield). An ultraviolet spectrum in ethanol gave a $\lambda_{max}$ of 382 nm. $\epsilon$ was 40,500.

3. p-Methoxyphenyl-(N-ethyl-1,2,3,4-tetrahydro-6-quinolyl)ketone

A mixture of 27.4 g of ethyl tetrahydroquinoline, 11.4 g of p-methoxyphenyl benzamide and 10.4 g of phosphorous oxychloride was heated at 100° C. under nitrogen with stirring until the reaction temperature reached 160° C. and a viscous mixture resulted. The stirring was stopped and heating at 100° C. was continued for 3 hours. A solution of 6.5 ml conc. hydrochloric acid diluted to 50 ml was added, the mixture heated to 100° C. and the solution filtered into 200 ml of water. The resultant oil was extracted with methylene chloride. The product was concentrated to 22.5 g, transferred to a Kugelrohr and distilled to give a red oil at 200° C. at 0.2 mm to yield 10.1 g.

4. 2,7 Bis-N,N-dimethylaminofluorenone 4.5 g Pyronin Y (Aldrich Chemical Co., Milwaukee, Wis.) was dissolved in 500 ml water and 10 ml 50% aqueous sodium hydroxide was added with stirring. The mixture was filtered and the solid washed with water. The solid was dissolved in conc. sulfuric acid, stirred at room temperature for 1.5 hours and poured onto 5 l of water. The solution was shaken 2X with 500 ml of ether, the ether layer dried with anhydrous magnesium sulfate and rotary evaporated to dryness. The solid was taken up in hot ethanol and the solution cooled to yield 0.4 g of a crystalline solid, m.p. 240°–242° C.

5. 2,7-Bis-N,N-dimethylamino-9,9-dimethyl-10-anthrone

A. Preparation of Methyl-m-N,N-dimethylaminobenzoate

A mixture of 2.5 ml concentrated hydrochloric acid, 300 ml methanol, 0.1 g 5% palladium on charcoal and 10 g of methyl m-nitrobenzoate was combined with 8.3 ml of a 40% formalin solution at 5° C. The mixture was hydrogenated at a hydrogen pressure of from 48 to 25 psi (3.37 to 1.76 kg/cm$^2$) in a period of one hour. The mixture was filtered, the methanol evaporated off with a rotary evaporator and 100 ml of water was added. Potassium carbonate was added until a pH of 8-9 was obtained. The product was extracted with 100 ml of ether, the ether layer dried with anhydrous magnesium sulfate and the ether was removed by rotary evaporation to yield 9.17 g. The preparation was repeated on a 5X scale and the crude products were combined. The combined products were shaken with 10 ml acetic anhydride, 10 ml pyridine and 100 ml water and the product extracted 2 times with 100 ml ether. The ether layer was dried over anhydrous magnesium sulfate, filtered, rotary evaporated to an oil that was vacuum distilled to yield 35.31 g, b.p. 104° C. at 0.65 mm.

B. Preparation of 2-m-N,N-dimethylaminophenylpropan-2-ol

Methyl iodide 88.7 g was added to 14.52 g of magnesium turnings in 200 ml of dry ether to prepare methyl magnesium iodide, 25 g methyl-m-N,N-dimethylaminobenzoate was added with stirring, the mixture was refluxed for 1 hour, cooled to room temperature and 100 ml of 10% aqueous ammonium chloride solution was added. The ether layer was dried over magnesium sulfate and concentrated to 24.3 g of an oil product.

C. Preparation of 2-m-N,N-dimethylaminophenylpropene

Ten grams of 2-m-N,N-dimethylaminophenylpropan-2-ol was combined with 10 g of freshly fused and crushed potassium hydrogen sulfate and 0.1 g of p-methoxyphenol. The mixture was heated to 150° C. for 2 hours, cooled, poured into 100 ml water containing 10 g of sodium hydroxide. The product was extracted 2 times with 50 ml ether, the extract dried over magnesium sulfate, concentrated and the oil vacuum distilled to yield 4.6 g of a colorless oil b.p. 63°-65° C. at 0.1 mm.

D. Preparation of bis-p-N,N-dimethylaminophenyl-2-isopropenyl-4-N,N,-dimethylaminophenylmethane A mixture of 6.44 g of Michler's hydrol, 4.6 g 2-m-N,N-dimethylaminophenylpropene and 52 ml of 2N hydrochloric acid was refluxed 12 hours, cooled to room temperature, and poured into 1 l of 1N sodium hydroxide was rapid stirring to yield 10.1 g of light blue solid after filtration and drying.

E. Preparation of 2,7-bis(p-N,N-dimethylamino)-9,9-dimethyl-10-p-N,N-dimethylaminophenyl-9,10-dihydroanthracene Ten and one tenth grams of bis-p-N,N-dimethylaminophenyl-2-isopropenyl-4-N,N-dimethylaminophenylmethane was added to 100 ml of concentrated sulfuric acid. This was kept at room temperature for 24 hours and poured into ammonium hydroxide with rapid stirring to yield a light blue solid which was washed 3 times with 100 ml of water and air dried to yield 9.5 g of product.

F. Preparation of 2,7-bis(p-N,N-dimethylamino)-9,9-dimethyl-10-p-N,N-dimethylaminophenyl-9,10-dihydro-10-anthranilium chloride To 5.62 g lead nitrate pentahydrate dissolved in 50 ml water was added 90 ml of Chlorox ® bleach. The mixture was boiled for 15 minutes, cooled to room temperature and the supernatant decanted off from the lead oxide. The solid was washed 3 times with 100 ml of water. A solution of 7.04 g of 2,7-bis(p-N,N-dimethylamino)-9,9-dimethyl-10-p-N,N-dimethylaminophenyl-9,10-dihydroanthracene in 200 ml water containing 8.5 ml concentrated hydrochloric acid and 45 g of crushed ice was added to the lead oxide slurry. The dark blue mixture was stirred 2 hours and a solution of 19.3 g of sodium sulfate in 20 ml water was added. The mixture was filtered, 2.9 g sodium acetate and 65 g sodium chloride added to the filtrate and the mixture filtered 12 hours later to yield 6.5 g of a blue solid after drying.

G. Preparation of 2,7-bis-N,N-dimethylamino-9,9-dimethyl-10-anthrone

Six and one-half grams of 2,7-bis(p-N,N-dimethylamino)-9,9-dimethyl-10-p-N,N-dimethylaminophenyl-9,10-dihydro-10-anthranilium chloride was dissolved in 500 ml ethanol. Eighteen and two-tenths ml of 1N sodium hydroxide solution was added followed by 300 ml of 30% hydrogen peroxide. A green solid was collected by filtration, was air dried, dissolved in ether and chromatographed on alumina prep plates to yield 0.1 g of a light yellow solid which was rechromatographed two more times to yield 0.05 g of a yellow solid with m.p. of 204°-206° C. Literature m.p. of 207°-208° C. was reported by C. Aaron, C. Baker, J. Chem. Soc., 2655 (1963).

EXAMPLES 1 to 3

The following photosensitive compositions were prepared:

| Ingredient | Amount (g) | | |
|---|---|---|---|
| | 1 | 2 | 3 |
| Bis(9-julolidyl)ketone | 0.015 | — | — |
| Bis-(N—ethyl-1,2,3,4-tetrahydro-6-quinolyl)ketone | — | 0.015 | 0.076 |
| Tetraethyleneglycol dimethacrylate | 0.226 | 0.226 | 0.226 |
| Bis(2-o-chlorophenyl-4,5-diphenylinidazole | 0.130 | 0.130 | 0.130 |
| Copolymer of styrene/maleic anhydride (1.4/1) partially esterified with isobutanol mixture, acid No. 190, mol. wt. ca. 10,000 | 0.554 | 0.554 | 0.554 |
| Terpolymer of ethyl acrylate (56.6), methyl methacrylate (37.6), acrylic acid (7.0), acid no. 76-85; mol. wt. ca 100,000 | 0.533 | 0.533 | 0.533 |
| Methylene chloride | 7.95 | 7.95 | 7.95 |
| Methanol | 0.6 | 0.6 | 0.6 |

Each composition was coated on the resin subbed side of a 0.004 inch (0.01 cm) polyethylene terephthalate film support using a 0.002 inch (0.005 cm) doctor knife, the resultant film air dried and a 0.001 inch (0.0025 cm) polyethylene terephthalate cover sheet laminated over the coating at 180° F. (82° C.) and at 4 ft/min (121.9 cm/min). A $\sqrt[3]{2}$ stepwedge target was placed over the film which was then contacted in a vacuum frame. An exposure was made with a 2000 watt mercury photopolymer Addalux lamp at a distance of 38 inches (96.5 cm) using an Ascor ® Light Integrator Platemaker Model 1415-12 with a Berkey Ascor ® 1601-40 light source. The films were exposed 5 units and after a two minute hold time the cover sheets were removed and the films were developed for 6 seconds at 22° C. in a solution of 84 g of potassium carbonate 1.5 hydrate, 5 g potassium hydrogen carbonate and 1536 g distilled water followed by 40 psi (2.81 kg/sq cm) 32° C. spray water rinsing. The number of $\sqrt[3]{2}$ steps of polymeric image are shown in Table I.

TABLE I

| Example | % Compound | $\sqrt[3]{2}$ Stepwedge Response |
|---------|-----------|-------------------------------|
| 1 | 1 | 21 |
| 2 | 1 | 15 |
| 3 | 5 | 22 |

EXAMPLE 4

The following photosensitive composition was prepared:

| Ingredient | Amount (g) |
|-----------|-----------|
| 4-Trichloromethyl-4-methyl-2,5-cyclohexadienone | 0.128 |
| Bis(9-julolidyl) ketone | 0.022 |
| Tetraethyleneglycol dimethacrylate | 0.229 |
| Terpolymer described in Examples 1-3 | 0.540 |
| Copolymer of styrene/maleic anhydride described in Examples 1-3 | 0.561 |
| Methylene chloride | 8.06 |
| Methanol | 0.61 |

This solution was coated, laminated, exposed for five units and developed for 6 seconds as described in Examples 1-3 to yield 5 $\sqrt[3]{2}$ steps of polymeric image.

EXAMPLE 5

The following photosensitive compositions were prepared:

| Ingredient | Amount (g) Example 5 | Control |
|-----------|-----------|---------|
| Bis-(N—ethyl-1,2,3,4-tetrahydro-6-quinolyl) ketone | 0.013 | — |
| Bis(2-o-chlorophenyl-4,5-diphenyl-imidazole) | — | 0.87 |
| Tetraethyleneglycol dimethacrylate | 0.229 | 1.79 |
| Terpolymer described in Examples 1-3 | 0.540 | 3.56 |
| Copolymer of styrene/maleic anhydride described in Examples 1-3 | 0.561 | 3.78 |
| Methylene chloride | 7.95 | 52.87 |
| Methanol | 0.6 | 4.01 |

These solutions were coated and the films laminated, exposed and developed for 6 seconds as described in Examples 1-3. The results of the exposures are:

| Example | Exposure (units) | $\sqrt[3]{2}$ Stepwedge Response |
|---------|-----------------|-------------------------------|
| 5 | 50 | 12 |
| Control | 200 | 15 |

EXAMPLES 6-8

The following photosensitive compositions were prepared:

| Ingredient | 6 | Control | 7 | Control | 8 | Control |
|-----------|---|---------|---|---------|---|---------|
| Bis-(N—ethyl-1,2,3,4-tetrahydro-6-quinolyl) ketone | 0.014 | — | 0.014 | — | 0.014 | — |
| Benzophenone | 0.071 | 0.071 | — | — | — | — |
| Benzoin methyl ether | — | — | 0.071 | 0.070 | — | — |
| 9-Xanthenone | — | — | — | — | 0.071 | 0.070 |
| Tetraethyleneglycol dimethacrylate | 0.229 | 0.229 | 0.229 | 0.229 | 0.229 | 0.229 |
| Terpolymer described in Examples 1-3 | 0.540 | 0.540 | 0.540 | 0.540 | 0.540 | 0.540 |
| Copolymer of styrene/maleic anhydride described in Examples 1-3 | 0.561 | 0.561 | 0.561 | 0.561 | 0.561 | 0.561 |
| Methylene chloride | 8.06 | 8.06 | 8.06 | 8.06 | 8.06 | 8.06 |
| Methanol | 0.61 | 0.61 | 0.61 | 0.61 | 0.61 | 0.61 |

These solutions were coated and the films laminated, exposed and developed for 6 seconds as described in Examples 1-3. The results of the exposures are:

| Example | Exposure (units) | $\sqrt[3]{2}$ Stepwedge Response |
|---------|-----------------|-------------------------------|
| 6 | 50 | 13 |
| Control | 500 | 2 |
| 7 | 50 | 14 |
| Control | 200 | 9 |
| 8 | 50 | 13 |
| Control | 500 | 4 |

EXAMPLE 9

A photosensitive composition was prepared:

| Ingredient | Amount (g) |
|-----------|-----------|
| Trimethylolpropane triacrylate | 150.82 |
| Copolymer described in Examples 1-3 | 167.47 |
| Terpolymer of methylmethacrylate(71)/ethyl acrylate(17)/acrylic acid(12), Mw 150,000 | 111.64 |
| Terpolymer of methylmethacrylate(55)/ethyl acrylate(35)/acrylic acid(10); Mw 50,000 | 82.33 |
| Benzophenone | 28.5 |
| Bis(2-o-chlorophenyl-4,5-diphenyl-imidazole) | 11.4 |
| Bis[2-2'-chlorophenyl-4,5 bis-(3',4'-dimethoxyphenyl-imidazole) | 11.4 |
| Benzotriazole | 2.28 |
| Victoria ® green dye, C.I. Basic Green 4 | 0.29 |
| Tri(p-N,N—dimethylaminophenyl)methane | 1.14 |
| 1,4,4-Trimethyl-2,3-diazabicyclo[3.2.2]non-2-ene-N,N'—dioxide | 0.17 |
| p-Toluene sulfonic acid | 0.57 |
| Bis-(N—ethyl-1,2,3,4-tetrahydro-6-quinolyl) ketone | 2.85 |
| Methanol | 89.7 |
| Methylene chloride | 1045.0 |

This solution was extrusion die coated on 0.001 inch (0.0025 cm) polyethylene terephthalate film to a thickness of 0.0013 inch and a 0.001 inch polyethylene cover sheet laminated to it. After removal of the cover sheet the dry coating was laminated to freshly scrubbed copper surfaced epoxy boards at 240° F. (116° C.), 2 feet/minute (0.61 m/minute), 40 psi (2.81 kg/sq cm). The laminated boards were exposed with the light source described in Examples 1–3 for 9 units through a $\sqrt{2}$ stepwedge to yield after development 24 $\sqrt{2}$ stepwedge steps of polymer. The development was in a Riston ® processor (E. I. duPont deNemours and Company, Wilmington, Del.) containing a 1% solution of sodium carbonate in tap water (pH about 10.4) at 105° F. (41° C.).

EXAMPLES 10 AND 11

The compositions of Examples 10 and 11 were prepared and coated with a 0.010 inch (0.25 mm) doctor knife on 0.001 inch (0.0025 cm) polyethylene terephthalate film with the film moving under the knife at 6 ft (183 cm)/min and dried at 120° F. (49° C.) for 2 minutes in a forced air dryer before lamination of a polyethylene cover sheet at 160° F. (71° C.), 40 psi (2.8 kg/cm$^2$), 183 cm/min. The films were laminated to freshly scrubbed copper surfaced epoxy boards at 240° F. (115° C.), 2 ft (61 cm)/min. 40 psi (2.8 kg/cm$^2$). The laminated boards were exposed with a 2.5 kw Hg xenon lamp with a 500-mm Bausch and Lomb monochromator set at 365 nm. The irradiance level was determined with a YSI Model 65 radiometer.

| Ingredient | Amount (g) | |
|---|---|---|
| | 10 | 11 |
| Polyoxyethylated trimethylol propane triacrylate | 2.312 | 2.312 |
| Victoria Green C.I. Basic Green 4 | 0.006 | 0.006 |
| Copolymer of 50/50 styrene/maleic anhydride esterified with isobutanol mixture; Mw 20,000; Tg is 210° C. | 4.805 | 4.805 |
| Terpolymer described in Examples 1–3 | 4.805 | 4.805 |
| 1,4,4-Trimethyl-2,3-diazabicyclo[3.2.2]non-2-ene-N,N'—dioxide | 0.012 | 0.012 |
| Benzotriazole | 0.062 | 0.062 |
| Sodium bis-dioctylsulfosuccinate | 0.617 | 0.617 |
| 2-Mercaptobenzoxazole | 0.092 | 0.092 |
| Trimethylolpropane triacrylate | 1.582 | 1.582 |
| Block copolymer of ethylene glycol and propylene glycol; Mw is 3,200 | 0.462 | 0.462 |
| Tris(p-N,N—dimethylaminophenyl)methane | 0.039 | 0.039 |
| Bis(2-o-chlorophenyl-4,5-diphenylimidazole | 0.588 | 0.588 |
| p-Methoxyphenyl-(N—ethyl-1,2,3,4-tetrahydro-6-quinolyl) ketone | 0.015 | — |
| 2,7-bis-N,N—dimethylamino fluorenone | — | 0.015 |
| Methylene chloride | 37.2 | 37.2 |
| Methanol | 2.4 | 2.4 |

| Example | mJ/cm$^2$ for 12 $\sqrt[3]{2}$ Steps of Polymer |
|---|---|
| 10 | 23 |
| 11 | 23 |

EXAMPLES 12 TO 16

Nonpigmented aqueous washout films were prepared according to the procedure given for Examples 1–3 except that the the coatings were prepared with the doctor knife held rigid as the film base was passed underneath at 6 ft (183 cm)/minute. The coated films passed through a 120° F. (~49° C.) forced air dryer with a contact time of 2 minutes and were laminated at 180°–195° F. (82°–90° C.), 40 psi (2.8 kg/cm$^2$) at 6 ft (183 cm)/minute.

The compositions and film responses are:

TABLE II

| Ingredient | 12 | Control | 13 | Control | 14 | Control | 15 | Control | 16 | Control |
|---|---|---|---|---|---|---|---|---|---|---|
| Tetraethyleneglycol dimethacrylate | 0.226 | 0.226 | 0.226 | 0.226 | 0.226 | 0.226 | 0.226 | 0.226 | 0.226 | 0.226 |
| Terpolymer of Examples 1–3 | 0.533 | 0.533 | 0.533 | 0.533 | 0.533 | 0.533 | 0.533 | 0.533 | 0.533 | 0.533 |
| Styrene, maleic anhydride copolymer of Ex. 1–3 | 0.554 | 0.554 | 0.554 | 0.554 | 0.554 | 0.554 | 0.554 | 0.554 | 0.554 | 0.554 |
| Bis(2-o-chlorophenyl-4,5-diphenylimidazole) | 0.130 | 0.130 | 0.130 | 0.130 | 0.130 | 0.130 | 0.130 | 0.130 | 0.130 | 0.130 |
| Bis-(N—ethyl-1,2,3,4-tetrahydro-6-quinolyl) ketone | 0.013 | — | 0.013 | — | 0.013 | — | 0.013 | — | 0.013 | — |
| 2-Mercaptobenzothiazole | — | — | 0.007 | 0.007 | — | — | — | — | — | — |
| N—phenyl glycine | — | — | — | — | 0.007 | 0.007 | — | — | — | — |
| Stannous chloride dihydrate | — | — | — | — | — | — | 0.030 | 0.030 | — | — |
| Triphenyl phosphine | — | — | — | — | — | — | — | — | 0.030 | 0.030 |
| Methylene chloride | 7.95 | 7.95 | 7.95 | 7.95 | 7.95 | 7.95 | 7.95 | 7.95 | 7.95 | 7.95 |
| Methanol | 0.61 | 0.61 | 0.61 | 0.61 | 0.61 | 0.61 | 0.61 | 0.61 | 0.61 | 0.61 |
| Units exposure | 5 | 50 | 5 | 30 | 5 | 30 | 10 | 30 | 2 | 30 |
| $\sqrt[3]{2}$ steps of polymeric image | 11 | 15 | 12 | 15 | 13 | 17 | 19 | 22 | 12 | 21 |
| Relative photospeed | 4.0 | 1.0 | 5.0 | 1.7 | 6.3 | 2.6 | 12.7 | 8.4 | 12.5 | 6.7 |

EXAMPLES 17 TO 18

The following photosensitive compositions were prepared:

| Ingredient | 17 | 18 | Control |
|---|---|---|---|
| Bis(2-o-chlorophenyl-4,5-diphenylimidazole | 0.604 | 0.202 | 0.604 |
| Trimethylolpropanetrimethacrylate | 2.720 | 0.907 | 2.720 |
| Polyoxyethylated trimethylolpropanetriacrylate | 0.604 | 0.202 | 0.604 |
| Polymethylmethacrylate, Mw 200,000; Tg 105° C. | 1.285 | 0.428 | 1.285 |
| Polyvinylacetate, Mw 90,000, Air Products and Chemicals, Inc., Allentown. Pa. | 1.285 | 0.428 | 1.285 |
| Polyoxyethylene lauryl ether | 0.604 | 0.202 | 0.604 |
| 2-Mercaptobenzoxazole | 0.227 | 0.076 | 0.227 |

| Ingredient | 17 | 18 | Control |
|---|---|---|---|
| Bis-(N—ethyl-1,2,3,4-tetrahydro-6-quinolyl) ketone | 0.230 | — | — |
| 2,7-bis-N,N—dimethylamino-9,9-dimethyl-10-anthrone | — | 0.077 | — |
| Methylene chloride | 22.57 | 7.52 | 22.57 |

Each composition was coated on 0.001 inch (0.0025 cm) polyethylene terephthalate film support using a 0.002 inch (0.005 cm) doctor knife, the resultant film was air dried and a 0.001 inch (0.0025 cm) polyethylene cover sheet laminated at 150° F. (65.6° C.) at 3 ft (0.91 m)/min. The cover sheets were delaminated and the film laminated at room temperature at 3 ft/min (0.91 m/min) onto Krome-Kote® paper. The laminates were exposed through $\sqrt{2}$ stepwedge targets with the same source used for Examples 1-3. After a two-minute hold time after exposure the polyethylene terephthalate was delaminated and the image toned with CROMALIN® toner. The number of $\sqrt{2}$ steps that were tack-free, accepting no toner, are:

| Example | # of $\sqrt{2}$ Not Toned |
|---|---|
| 17 | 7 |
| 18 | 6 |
| Control | 3 |

EXAMPLE 19

This example illustrates the photospeed differences of the sensitizers of Examples 1 and 2 compared to Michler's ketone (control). The following six photosensitive compositions were prepared:

| Ingredient | Amount (g) | | | | | |
|---|---|---|---|---|---|---|
| | A | B | C | D | E | F |
| Bis(9-julolidyl)ketone | 0.015 | — | — | 0.045 | — | — |
| Bis-(N—ethyl-1,2,3,4-tetrahydro-6-quinolyl) ketone | — | 0.015 | — | — | 0.045 | — |
| Michler's ketone | — | — | 0.015 | — | — | 0.045 |
| Tetraethyleneglycol dimethacrylate | 0.226 | 0.226 | 0.226 | 0.226 | 0.226 | 0.226 |
| Bis(2-o-chlorophenyl-4,5-diphenylimidazole | 0.130 | 0.130 | 0.130 | 0.130 | 0.130 | 0.130 |
| Copolymer of Example 1 | 0.554 | 0.554 | 0.554 | 0.554 | 0.554 | 0.554 |
| Terpolymer of Example 1 | 0.533 | 0.533 | 0.533 | 0.533 | 0.533 | 0.533 |
| Methylene chloride | 7.95 | 7.95 | 7.95 | 7.95 | 7.95 | 7.95 |
| Methanol | 0.6 | 0.6 | 0.6 | 0.6 | 0.6 | 0.6 |

The solutions were coated and the resultant films dried and cover sheets applied as described in Example 1. The films were exposed and developed as described in Example 1. The number of $\sqrt[3]{2}$ steps of polymeric image and the relative photospeeds are:

| Composition | Wt. % Sensitizer | $\sqrt[3]{2}$ Stepwedge Response | Relative Photospeed |
|---|---|---|---|
| A | 1 | 21 | 6.3 |
| B | 1 | 15 | 1.6 |
| C | 1 | 13 | 1 |
| D | 3 | 25 | 8.0 |
| E | 3 | 21 | 3.2 |
| F | 3 | 16 | 1 |

EXAMPLE 20

This example illustrates the relative phosphorescence quantum yield of compounds compared to Michler's ketone, $\phi p(X)/\phi p(Mk)$ and their fluorescence.

The following compounds' fluorescence and phosphorescence spectra were determined in 2-methyl tetrahydrofuran glass at 77° K. The relative quantum yield of phosphorescence was determined using the above formula; the higher the value the shorter the lifetime of the compound in the triplet state. Fluorescence is an observed phenomenon.

| Compound | Relative Phosphorescence Quantum Yield | Fluorescence |
|---|---|---|
| 1 Michler's ketone (control) | 1.00 | none detected |
| 2 Bis(9-julolidyl) ketone | 1.07 | small |
| 3 Bis-(N—ethyl-1,2,3,4-tetrahydro-6-quinolyl) ketone | 1.04 | small |
| 4 2,7-bis-N,N—dimethyl-aminofluorenone | 1.50 | very intense |
| 5 2,7-bis-N,N—dimethyl-amino-9,9-dimethyl-10-anthrone | 1.29 | very intense |

It is noted that even though compounds of the invention, 2 and 3, have a shorter lifetime in the triplet state and higher fluorescence than the control, Michler's ketone, as shown in the preceding Example 19, bis(9-julolidyl) ketone and bis-(N-ethyl-1,2,3,4-tetrahydro-6-quinolyl) ketone have improved photospeed when compared with a similar photopolymerizable composition wherein the contained ketones of the invention have been replaced by Michler's ketone.

We claim:

1. A photopolymerizable composition comprising an admixture of
   (a) at least one nongaseous ethylenically unsaturated compound having at least one terminal ethylenically unsaturated group, a boiling point above 100° C. at normal atmospheric pressure and being capable of addition polymerization.
   (b) at least one organic polymeric binder compound, the improvement wherein the composition contains
   (c) 0.001 to 15% by weight of the total composition of at least one constrained N-alkylamino aryl ketone of the formula:

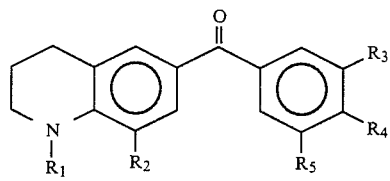

$R_1$ is lower alkyl of 1 to 4 carbons;

$R_2$ is H or taken together with $R_1$ is —CH$_2$CH$_2$CH$_2$—;

$R_4$ is H, —OCH$_3$ or

$R_6$ and $R_7$ are lower alkyl of 1 to 4 carbon atoms;

$R_3$ is H or taken together with $R_6$ is —CH$_2$CH$_2$CH$_2$—;

$R_5$ is H or taken together with $R_7$ is —CH$_2$CH$_2$CH$_2$—.

2. A photopolymerizable composition according to claim 1 which contains 0.001 to 20 parts by weight per 100 parts by weight of the combined weight of ethylenically unsaturated compound and binder at least one photoinitiator taken from the group consisting of hexaarylbiimidazoles, 4-trichloromethyl-4-methyl-2,5-cyclohexadienones, quinones, alkylaryl ketones, benzophenones, and mixtures thereof.

3. A photopolymerizable composition according to claim 2 wherein the photoinitiator is a hexaarylbiimidazole compound.

4. A photopolymerizable composition according to claim 1 wherein the ethylenically unsaturated compound and organic polymeric binder are present in relative amounts of 3 to 97 and 97 to 3 parts by weight, respectively.

5. A photopolymerizable composition according to claim 1 wherein the ketone compound is bis(9-julolidyl ketone).

6. A photopolymerizable composition according to claim 1 wherein the ketone compound is bis-(N-ethyl-1,2,3,4-tetrahydro-6-quinolyl)ketone.

7. A photopolymerizable composition according to claim 5 wherein the ethylenically unsaturated compound is tetraethyleneglycol dimethacrylate.

8. A photopolymerizable composition according to claim 6 wherein the ethylenically unsaturated compound is tetraethyleneglycol dimethacrylate.

9. A photopolymerizable element comprising a support bearing a layer of a composition according to claim 1.

10. A photopolymerizable element according to claim 9 wherein the support is copper.